(12) United States Patent
Algreatly

(10) Patent No.: US 9,341,848 B2
(45) Date of Patent: May 17, 2016

(54) METHOD OF 3D MODELING

(71) Applicant: Cherif Atia Algreatly, Newark, CA (US)

(72) Inventor: Cherif Atia Algreatly, Newark, CA (US)

(73) Assignee: Cherif Algreatly, Fremont, CA (US)

( * ) Notice: Subject to any disclaimer, the term of this patent is extended or adjusted under 35 U.S.C. 154(b) by 0 days.

(21) Appl. No.: 14/516,441

(22) Filed: Oct. 16, 2014

(65) Prior Publication Data

US 2015/0193972 A1 Jul. 9, 2015

Related U.S. Application Data

(60) Provisional application No. 61/961,601, filed on Oct. 17, 2013.

(51) Int. Cl.
*G02B 27/01* (2006.01)
*G06T 7/00* (2006.01)
*G06T 3/60* (2006.01)
*G06T 17/20* (2006.01)
*G06T 17/30* (2006.01)

(52) U.S. Cl.
CPC ............. *G02B 27/017* (2013.01); *G06T 3/60* (2013.01); *G06T 7/004* (2013.01); *G06T 17/20* (2013.01); *G06T 17/30* (2013.01)

(58) Field of Classification Search
CPC ........ G02B 27/017; G06T 7/004; G06T 3/60; G06T 17/20; G06T 17/30; G06F 3/04845
See application file for complete search history.

(56) References Cited

U.S. PATENT DOCUMENTS

2010/0034485 A1* 2/2010 Algreatly ............ G06F 3/04845
382/307

* cited by examiner

*Primary Examiner* — Kristy A Haupt

(57) ABSTRACT

Disclosed is a method for converting a freehand drawing into a 3D model corresponding to the freehand drawing in real time. This method can be used to automatically convert a picture of an object into a 3D model of the object for further interaction. The method can seamlessly be implemented by optical head-mounted computers to convert the picture of the objects located in front of the user into 3D models, even showing parts of the objects that are hidden from the user's direct line of view.

20 Claims, 16 Drawing Sheets

METHOD OF 3D MODELING

CROSS-REFERENCE TO RELATED APPLICATION

This application claims the benefits of a U.S. Provisional Patent Application No. 61/961,601, filed Oct. 17, 2013.

BACKGROUND 3D modeling is the process of developing a graphical representation of a 3D object via specialized 3D modeling software. Usually, 3D objects are represented by using a collection of points in 3D space, connected by various geometric entities such as triangles, lines, curved surfaces, etc. However, creating such points and geometric entities is not a simple task for everyone. In most cases, the user is required to learn one of the specialized 3D modeling software in order to construct a professional 3D model of an object. 3DS MAX, MEYA, AUTOCAD, SKETCHUP and REVIT are examples of 3D modeling software that are commercially available in the market. Learning how to operate each software application can be tedious and a waste of the user's effort. Moreover it takes too much time to implement the user's design using one of the software applications listed, especially if the 3D model represents a complex 3D object.

Until now, there has not been a method of 3D modeling that can be easily learned and swiftly creates the 3D model the user intends. If such a method exists, it will not only reduce the user's efforts and time when creating 3D models, but it will, due to its simplicity of execution, spur other non-designers to create 3D models. This could potentially advance the various fields of 3D modeling such as industrial design, architectural design, mechanical design, interior design, cartoon and film making.

SUMMARY

The present invention discloses a method of 3D modeling that converts the freehand sketches or drawings of a user into a 3D model in real time. The method starts by having the user draw a freehand sketch representing a view of the 3D model from a certain point of view. The freehand sketch is automatically converted into a partial 3D model representing the part of the 3D model that appears from this specific point of view. The user can rotate the partial 3D model to see it from a desired point of view and can then draw another freehand sketch, adding to the partial 3D model to represent another view of the 3D model. The freehand sketch is automatically converted into another partial 3D model that is integrating with the first partial 3D model. The user repeats the previous steps until reaching the complete desired 3D model.

In one embodiment of the present invention, the freehand sketch is drawn by the user's finger or stylus on the touchscreen of a computer. The user's freehand sketch is analyzed by the computer system to determine the 3D model represented by the freehand sketch and the point of view of the 3D model, according to the user's freehand sketch. The 3D model is then automatically generated and presented on the computer display. The color, texture or appearance of the 3D model can be selected by the user from a list of options that appear on the computer display or can be automatically generated by the computer system using a default setting.

In another embodiment, the user draws on top of a picture of a 3D object presented on the computer display. In this case, the lines of the user's freehand sketch are approximately aligned with the lines of the 3D object that appears in the picture. The 3D model created by the computer system matches the appearance of the 3D object presented in the picture. When the user rotates the 3D model to draw another part of the 3D model that does not appear in the picture, this new part automatically appears similar to the parts of the 3D model that are shown in the picture.

In one embodiment, each freehand sketch represents a 3D shape such as a cube, prism, pyramid, sphere or cylinder. A combination or de-combination of a set of such 3D shapes successively provided by the user's freehand sketches represents the final 3D model of the object that the user is creating. This method is helpful when constructing 3D models of buildings, machines or the like. In another embodiment, each freehand sketch represents a freeform surface. A combination of a set of such freeform surfaces, provided with each successive input of the user's freehand sketches, represents the final 3D model of whatever object the user is creating. This method is suitable for creating 3D models of a human's body, animal, a bird or the like. In yet another embodiment, each freehand sketch represents a collection of polygons. A combination of a set of such a collection of polygons represents the final 3D model of the user's desired object.

The main advantages of the present invention are the ease-of-use, speed of production, and most importantly, encouraging the user's creatively through an intuitive, simple input method. For example, when the present invention is implemented in software on a computer, tablet, or mobile phone with a touchscreen, the graphical user interface of the software includes no icons or menus at all for drawing. By utilizing the user's freehand sketch, it is possible to draw simple or complex shapes without any drawing tools. Once a user draws a two-dimensional view of a 3D model, the 3D model is automatically created in real time, thus dramatically increasing the user's productivity. Constructing a 3D model as quickly as the user can think up additions for the 3D model empowers the user's creativity, as will be described subsequently.

Generally, the above Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DETAILED DESCRIPTION OF INVENTION

Figure 1:
FIG. 1 illustrates a database storing a list of angles of views for a 3D model of a cube.

FIG. 1 illustrates an example of a database storing seven drawings for a 3D model of a cube. The first row in the database indicates the case number of the drawing that a user may draw or provide. The second row indicates the drawing that a user may provide in the form of a freehand sketch or drawing. The third row indicates the analysis of the drawing which describes the geometrical shapes contained in the drawing and the arrangement of these geometrical shapes relative to each other from up-to-bottom or from left-to-right. For example, the first drawing is comprised of a trapezoid and square positioned in a vertical order from top-to-bottom, while the third drawing is comprised of two trapezoids; one is bigger than the other and positioned in a horizontal order from left-to-right.

The fourth row indicates the identity of the 3D model represented in the drawing where the identity of all seven cases is a "cube". The fifth and sixth rows indicate the horizontal and vertical rotations of the 3D model according to the drawing and relative to a point of view. For example, the first drawing represents the cube when it is vertically rotated 45 degrees. The seventh drawing represents the cube when it is counter-clockwise rotated 45 degrees in both horizontal and vertical directions.

Once a user draws one of the aforementioned seven drawings on a computer display, the drawing is analyzed by the computer system to determine the geometrical shapes of its polygons and the arrangement of these geometrical shapes relative to each other. The result of the analysis is checked against the database to determine the identity of the 3D model represented in the drawing and the rotation of this 3D model according to the drawing. After that, the user's drawing is automatically replaced by the 3D model, and the 3D model is presented on the computer display according to the rotation associated with the drawing in the database.

Generally, the 3D models stored in the database can include 3D shapes other than cubes such as prisms, pyramids, spheres, cylinders or partial parts of these 3D shapes. Also, the vertical and horizontal rotations indicated in the database can be more detailed than what is shown in the previous example. For example, the rotation of the 3D model may include rotating the 3D model about the x, y, and z-axis.

Figure 2:
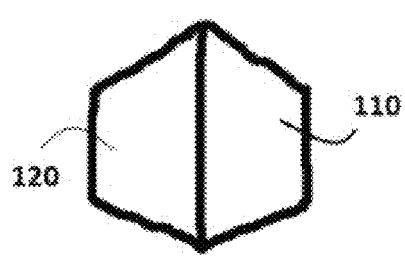
FIGS. 2 to 12 illustrate the method of the present invention to convert a freehand drawing into a 3D model, according to one embodiment.
Figure 3:
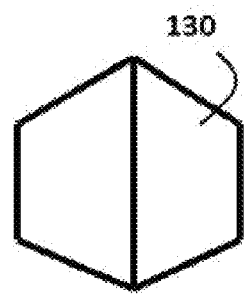

Using the database of the present invention to describe the identity of the 3D shapes in the drawing and their rotation allows for the creation of 3D models in an automated manner. For example, FIG. 2 illustrates a user drawn freehand sketch on a computer display, where the freehand drawing is comprised of two trapezoids 110 and 120, positioned in a horizontal order from left-to-right. Once the freehand drawing is analyzed and checked against the database of the present invention, the corresponding 3D model (cube) of the freehand drawing is presented on the computer display, as seen in FIG. 3. The 3D model, or cube 130, is presented with certain vertical and horizontal rotations that match the imaginary point of view that the user illustrated in the initial freehand drawing.

Figure 4:
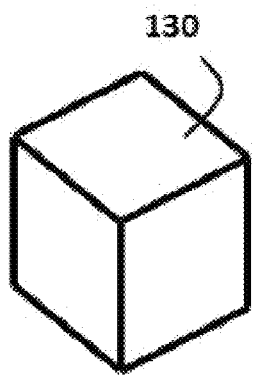
Figure 5:
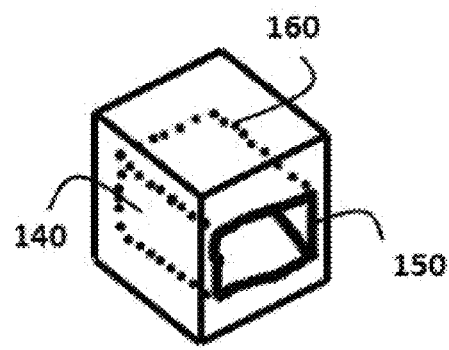
Figure 6:
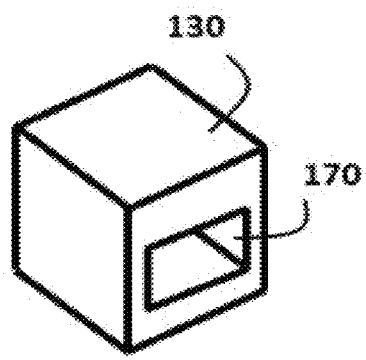
Figure 7:
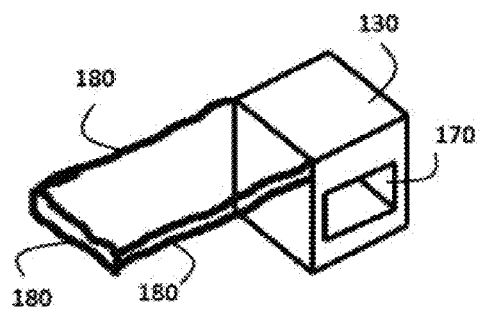
Figure 8:
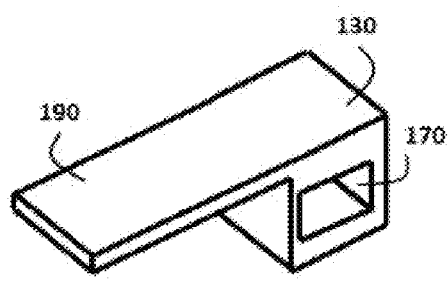

FIG. 4 illustrates vertically rotating the 3D model 130 by the user on the computer display to present three faces of the cube. In FIG. 5 the user draws a prism 140 using some solid lines 150 and dotted lines 160 to represent a void in the shape of a prism, located inside the cube. Accordingly, the solid and dotted lines are analyzed and checked against the database of the present invention to present a corresponding void or empty prism 170 as shown in FIG. 6. Generally, the present invention identifies the dotted lines as if they represent a hidden surface or object located behind another surface or object. In FIG. 7 the user draws three parallelograms 180 representing another prism attached to the top of the cube. The three parallelograms are analyzed and checked against the database of the present invention to present a corresponding prism 190 attached to the cube, as shown in FIG. 8.

Figure 9:
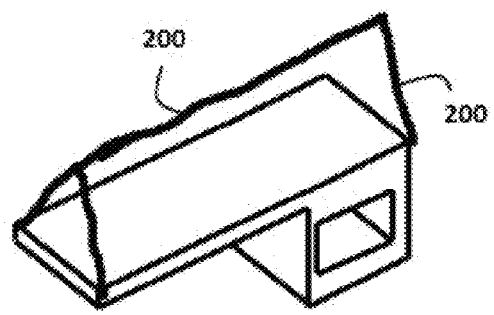
Figure 10:
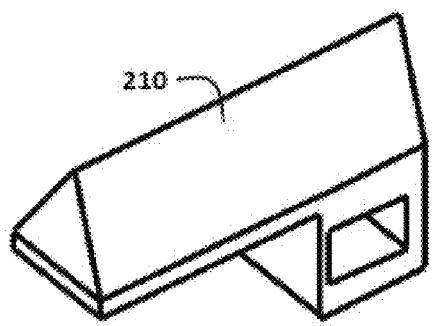
Figure 11:
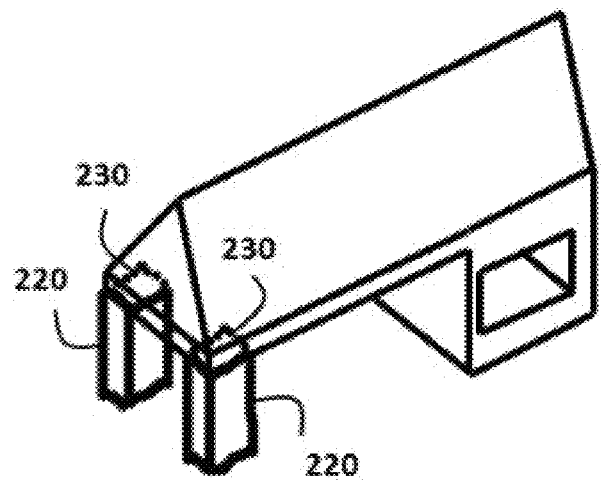
Figure 12:
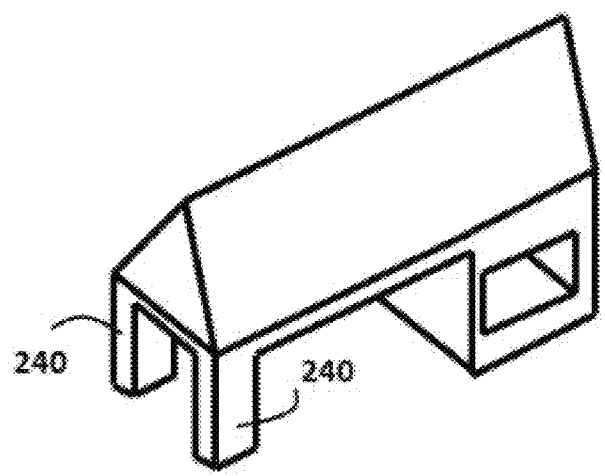

In FIG. 9 the user draws a freehand prism 200, and in FIG. 10 this freehand prism is automatically replaced with a corresponding 3D model of a prism 210. In FIG. 11 the user draws two sets of three parallelograms 220 and 230, and in FIG. 12 each one of the two sets of parallelograms is automatically replaced with a 3D model of a prism 240 presented on the computer display. As shown in the figure, the final 3D model represents a 3D model of a home that was created simply by successive freehand drawn lines on a computer display. During the creation of this 3D model the user was not obliged to use software drawing tool, as using a finger or stylus on the touchscreen of a computer, tablet or mobile phone is enough to create complex 3D models.

As described previously, the identity of the 3D model and the rotation of the 3D model are derived from the geometrical shapes indicated in the freehand drawing. The size or scale of the 3D model is determined by the overall width or height of the drawing. For example, drawing a freehand cube with a certain total width or height crafts the 3D model to comply with a width or height similar to the freehand cube. Also, the position or location of a part of a 3D model is determined by other parts of the 3D model that were previously created. For example, the location of the prism 190 of FIG. 8 is determined relative to the cube 130 that was previously created before the prism.

Figure 13:
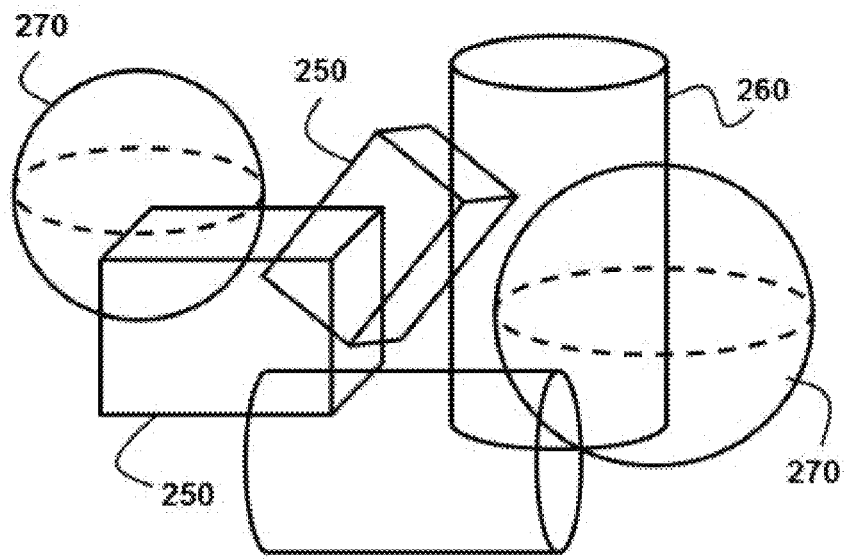
FIGS. 13 and 14 illustrate two 3D models created by the method of the present invention.
Figure 14:
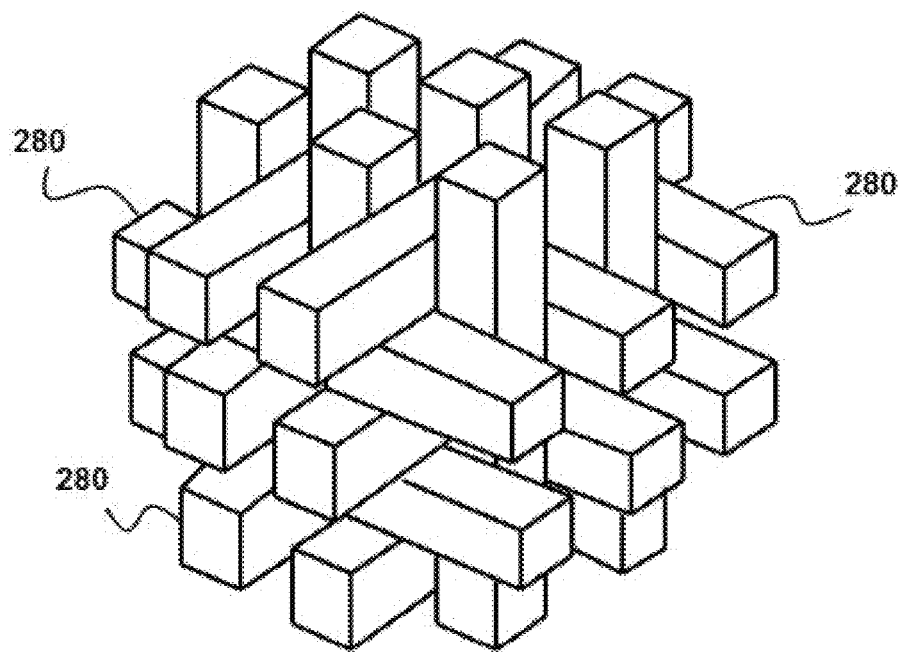

As mentioned previously, the database of the present invention stores various views of 3D shapes, such as a cube, prism, sphere or cylinder, each of which is associated with two-dimensional geometrical shapes. Once a user draws any of these two-dimensional geometrical shapes, the 3D shape most closely associated with the user's drawing is identified and presented on the computer display, replacing the user's drawings. FIG. 13 illustrates an example of a 3D model comprised of a plurality of prisms 250, cylinders 260 and spheres 270, intersecting with each other, and created by the method of the present invention. FIG. 14 illustrates another example of a complex 3D model comprised of a plurality of prisms 280 created by the method of the present invention.

As known in the art, the 3D model can be represented by a variety of techniques such as the constructive solid geometry (CSG) technique; Non-Uniform Rational B-Spline (NURBS) modeling; polygonal modeling; or point cloud technique. The CSG technique is based on creating a 3D model for an object by combining or de-combining a set of simple objects such as spheres, cylinders, or cubes. The NURBS modeling technique is based on generating a plurality of curves to represent a freeform surface. The polygonal modeling technique is based on representing or approximating the surfaces of a 3D model using a collection of polygons. The point cloud technique is based on representing a 3D model by a set of data points in a coordinate system.

In one embodiment, the present invention uses a database that stores basic 3D objects associated with geometrical shapes representing different views of the 3D objects. This type of database best suits 3D models which can be constructed by the CSG technique, as the previous examples illustrated in FIGS. 2 to 12.

Figure 15:
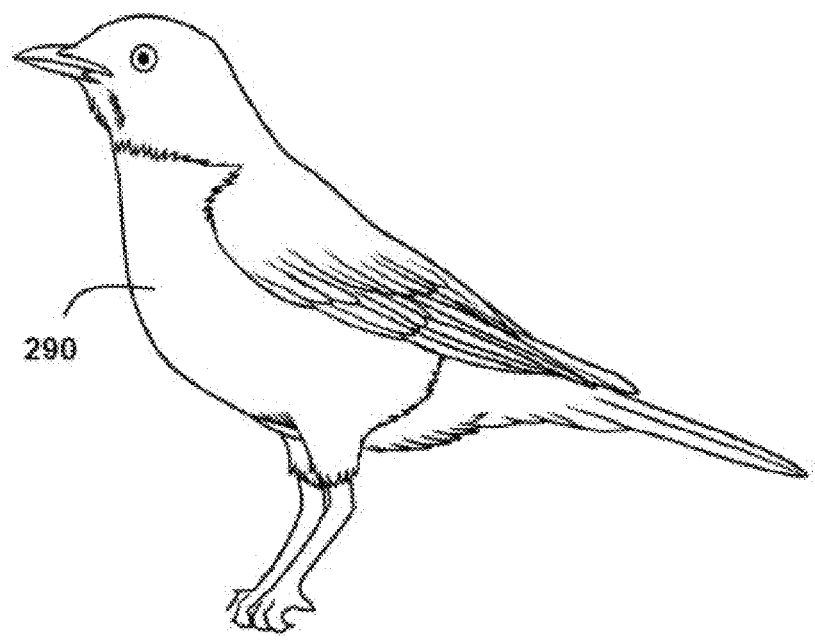
FIGS. 15 to 19 illustrate checking a freehand drawing of a bird against a database of 3D models so as to replace the freehand drawing with a 3D model of the bird.
Figure 16:
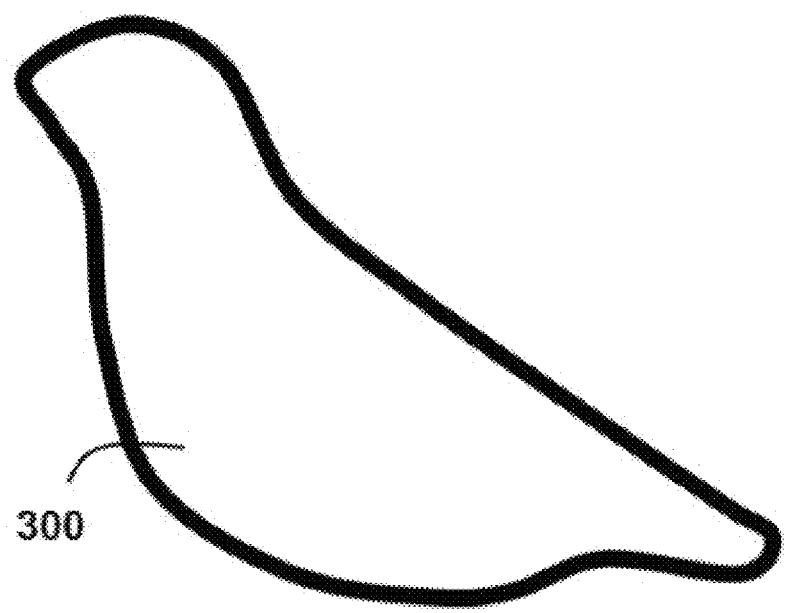
Figure 17:
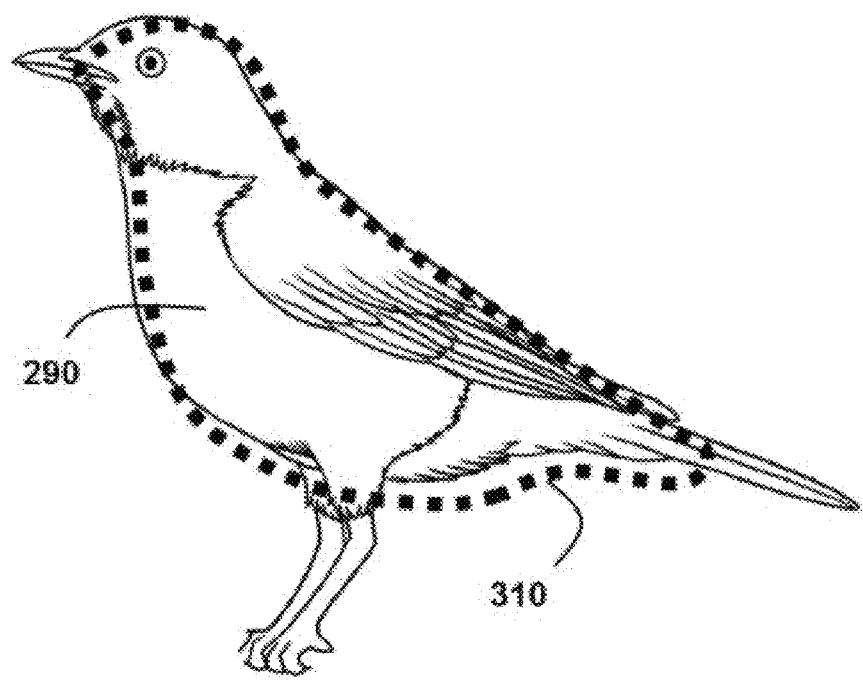

In another embodiment, the present invention uses a database that stores freeform surfaces associated with curved or freeform lines or polygons. This method best suits 3D models which that can be created using the NURBS modeling technique. For example, FIG. 15 illustrates a 3D model of a bird, where different views of this 3D model are stored in the database of the present invention. Each view stored in the database represents the shape of the bird from a different point of view such as the front view, back view, side view and top view. FIG. 16 illustrates a freehand drawing 300 of a user intending to create a 3D model of the bird. To automatically replace the freehand drawing with the 3D model of the bird, the freehand drawing is checked against the boundary lines of each view in the database. For example, FIG. 17 illustrates comparing the outlines of the freehand drawings, shown with dotted line 310, with the outlines of FIG. 15 of the bird 290, shown with sold lines. As depicted in FIG. 17, the two figures share a largely similar percentage of area.

Figure 18:
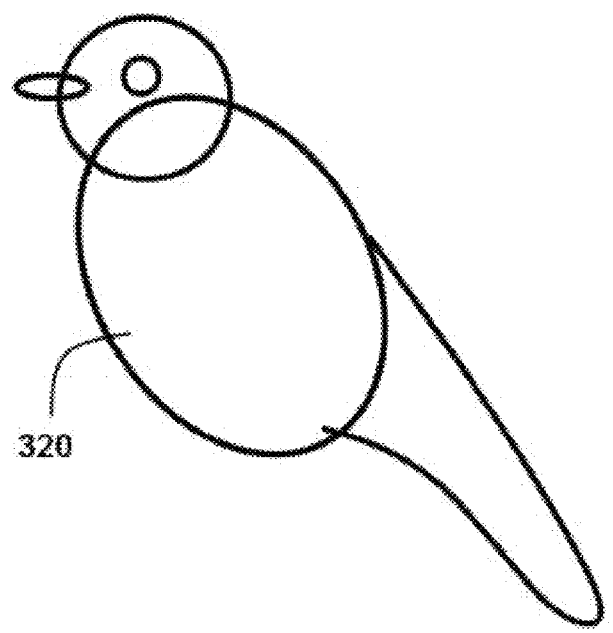
Figure 19:
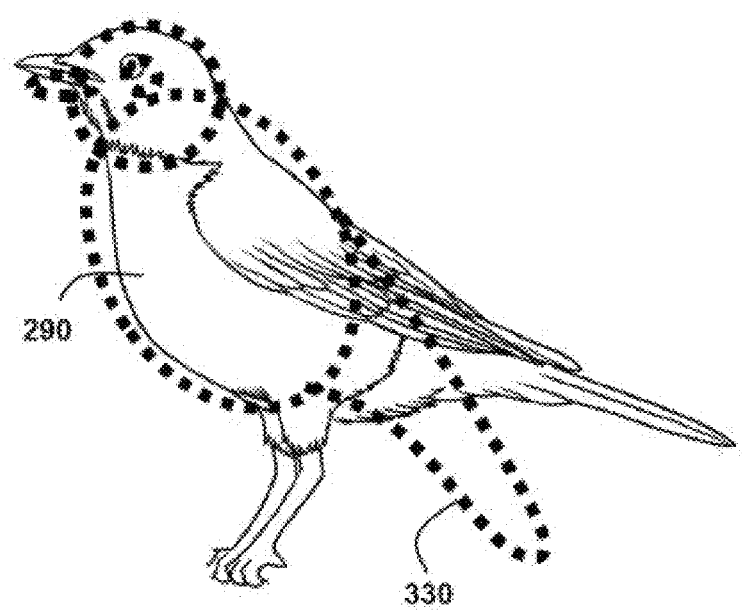

FIG. 18 illustrates another freehand drawing 320 where a user draws with the intent to create a 3D model of the bird. FIG. 19 illustrates comparing the outlines of the freehand drawings, shown with dotted line 330, with the outlines of FIG. 15 of the bird 290, shown with sold lines. As depicted in FIG. 19, the two figures share a large percentage of common area, which allows for the automatic replacement of the freehand drawing with the 3D model of the bird on the computer display. In one embodiment of the present invention, the process of comparing the freehand drawing with the views of the 3D models in the database involves some modification of the freehand drawing. These modifications include resizing the freehand drawing or stretching the total width or height of the freehand drawing as needed to correct any inaccurate ratios depicted in the user's drawings.

Figure 20:
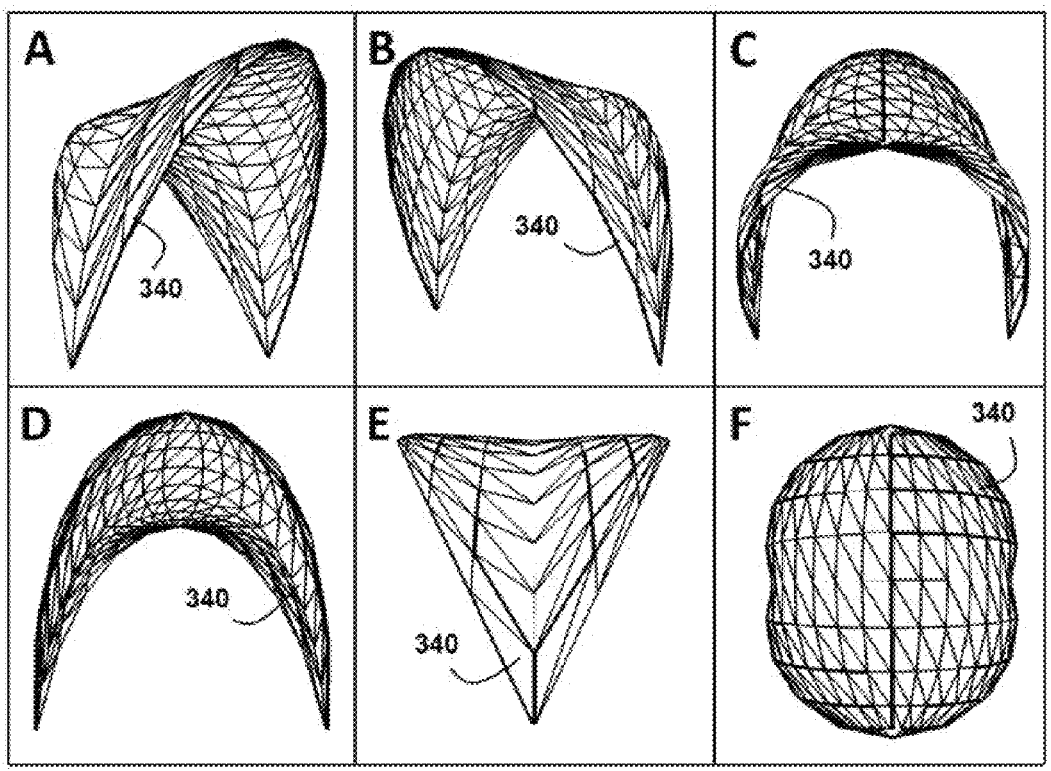
FIG. 20 illustrates a database of a 3D model created by the Non-Uniform Rational B-Spline modeling technique.
Figure 21:
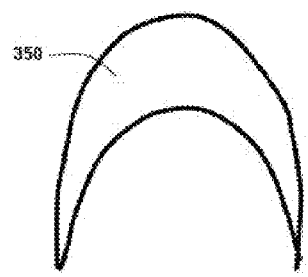
FIG. 21 illustrates a freehand drawing representing a 3D model.
Figure 22:
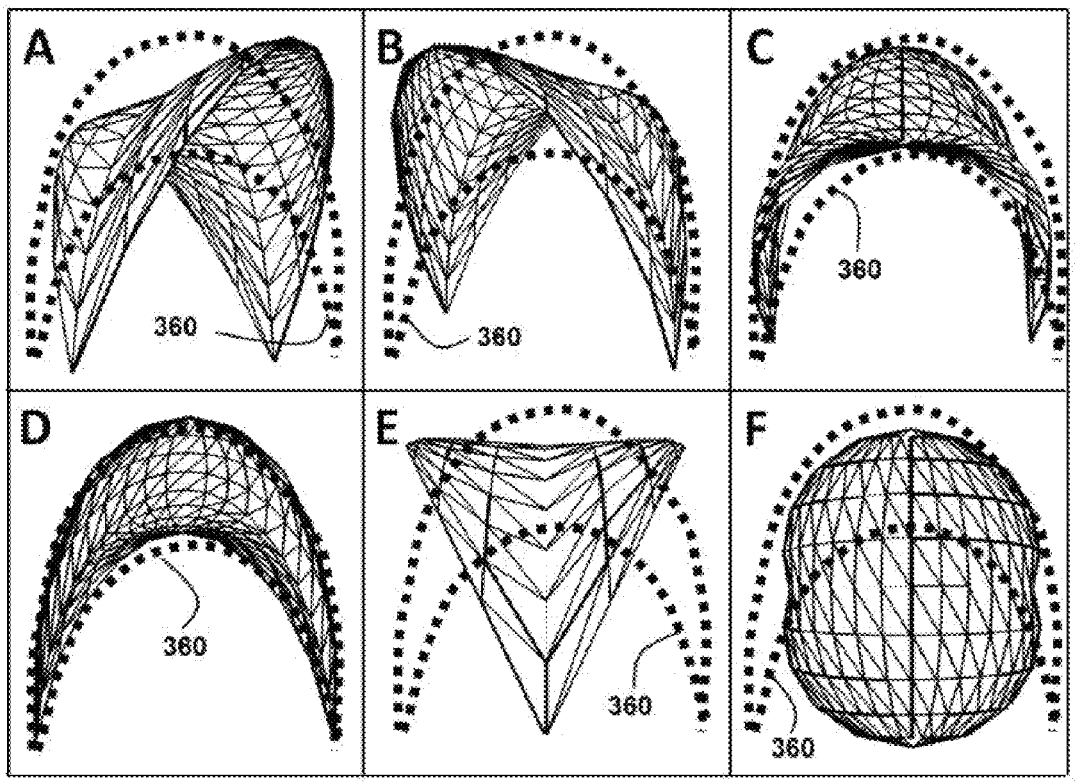
FIG. 22 illustrates checking the freehand drawing against the database of the 3D model.

Generally, comparing the common area between the freehand drawing of the user and the views of the 3D model stored in the database can also be used with 3D models which can be constructed by the polygonal modeling technique. For example, FIG. 20 illustrates six views of a 3D model of an object comprised of a plurality of polygons 340 attached to each other in three dimensions using the polygonal modeling technique. Each view or image is tagged with one of the English letters A, B, C, D, E, or F. FIG. 21 illustrates a freehand sketch 350 drawn by a user who intends to create a 3D model of the object depicted in FIG. 20. FIG. 22 illustrates the process of comparison between the freehand drawing and the different views or images stored in the 3D model database. As shown in the figure, the freehand drawing is represented by dotted lines 360, and the image "D" have more common areas with the dotted lines than other images. That means the freehand drawing represents the 3D model of the object so that it is plausible to automatically replace the freehand drawing with the 3D model "D" of the object.

If the database stores 3D models in the form of point cloud, the same method of the present invention is used. In this case, each 3D model can have its picture taken from different point of views via of the vertical and horizontal rotations of the virtual 3D model in front of a virtual camera. These pictures are associated with an ID or name of the 3D model and value for the vertical and horizontal rotations and stored in the database. Once the user provides a freehand drawing, the outlines of these drawings are compared with the outlines of the pictures of the 3D models in the database. If a drawing approximately matches a picture of the 3D model, then this 3D model automatically replaces the user's drawing.

Figure 23:
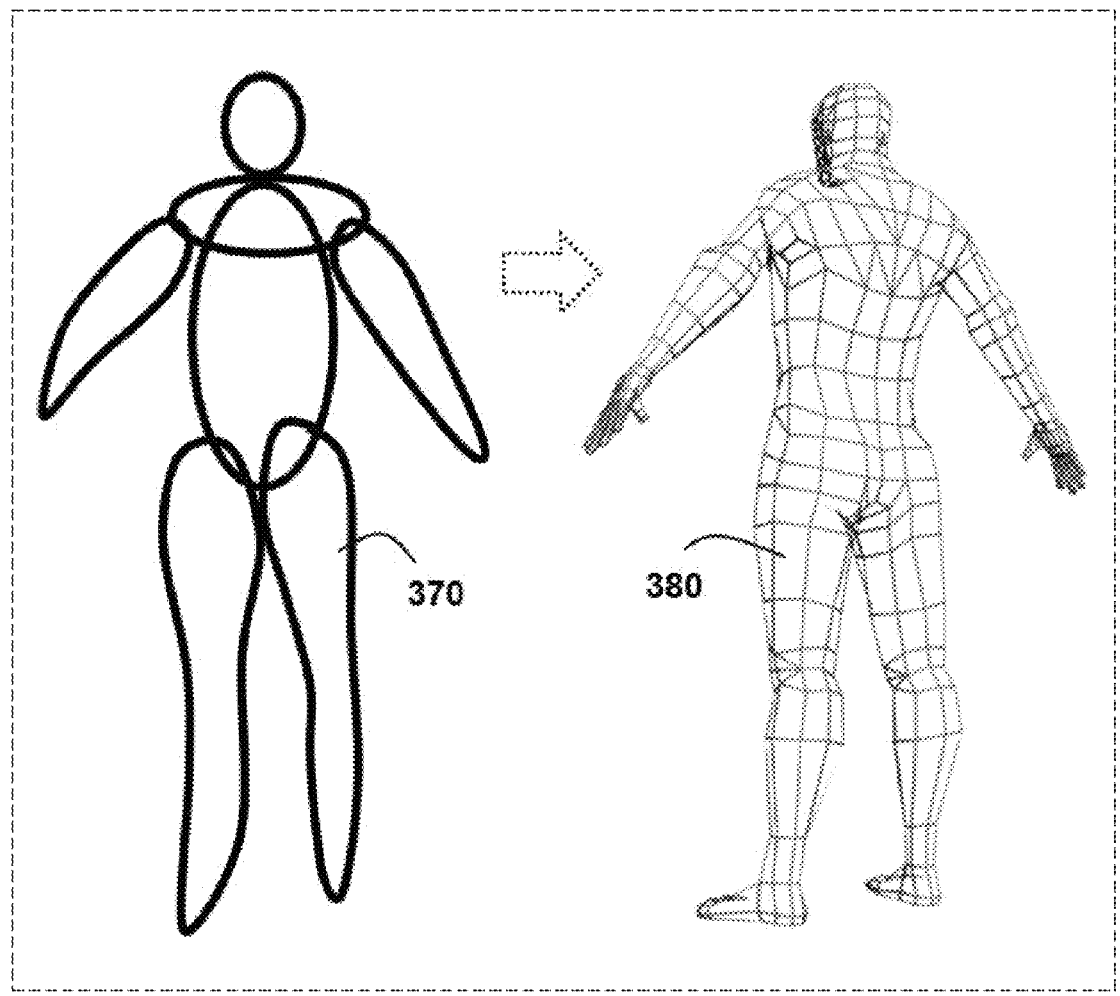
FIG. 23 illustrates a freehand drawing of a human's body which is automatically replaced with the 3D model of a human's body using the present invention.
Figure 24:
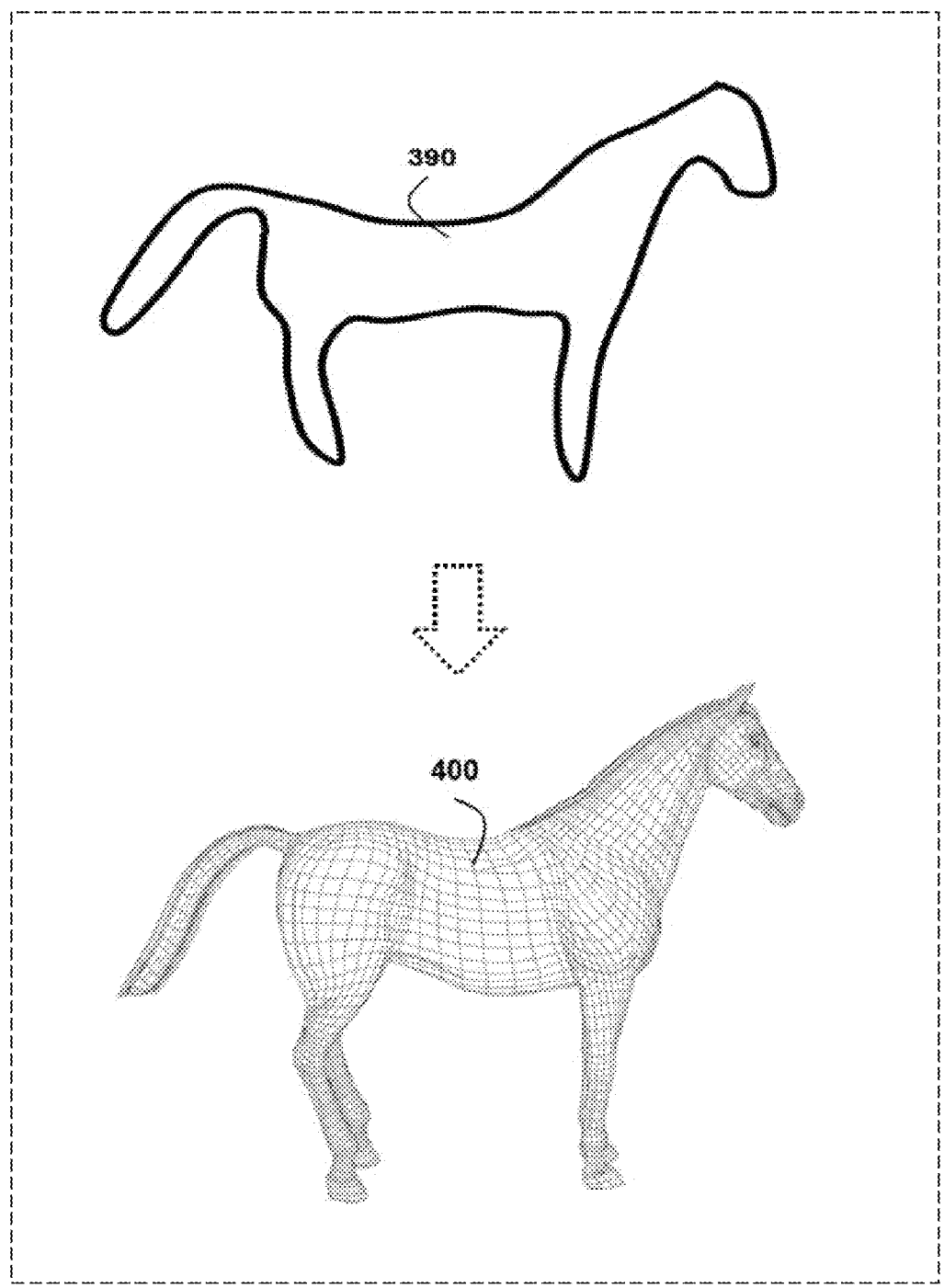
FIG. 24 illustrates a freehand drawing of a horse which is automatically replaced with the 3D model of a horse using the present invention.
Figure 25:
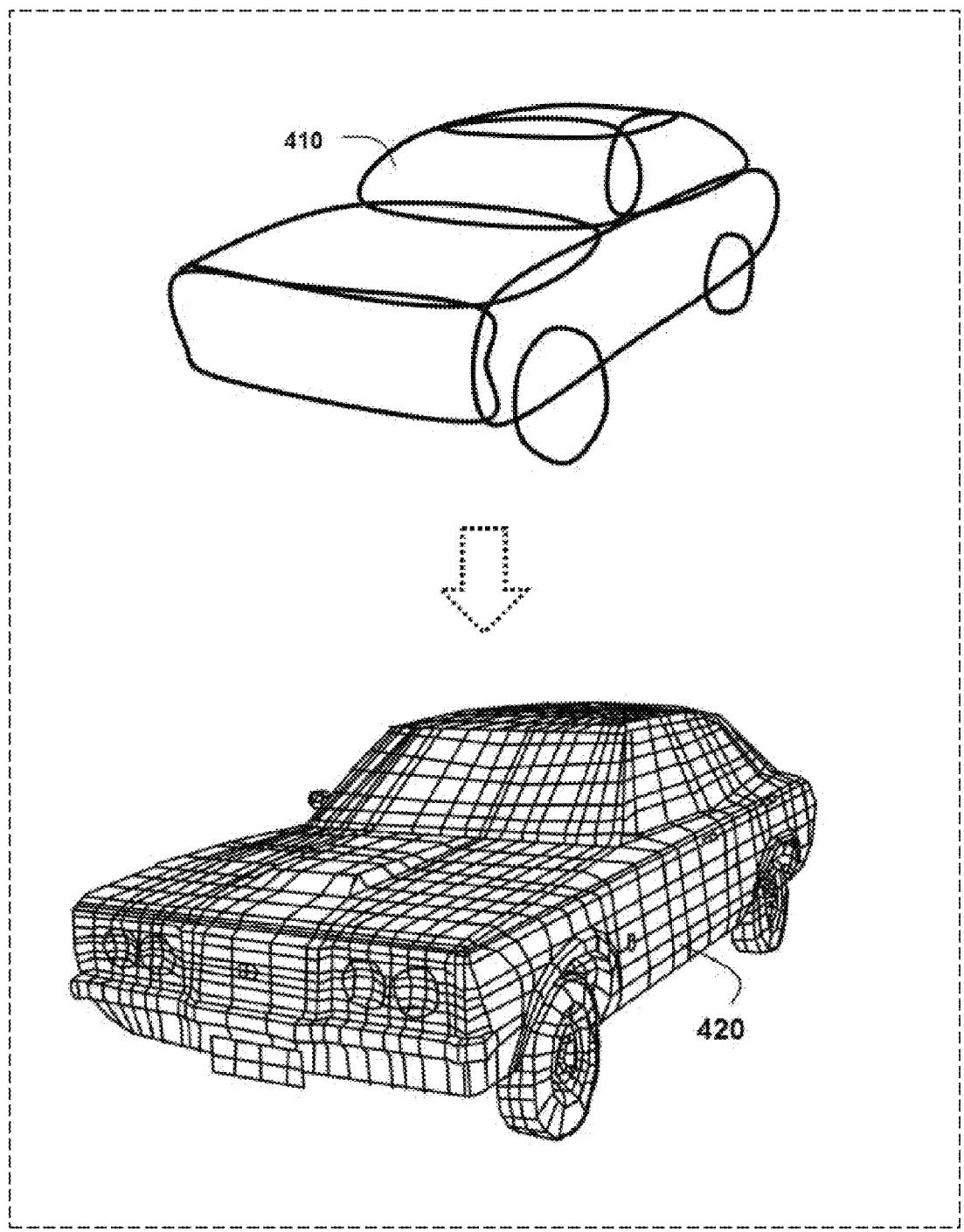
FIG. 25 illustrates a freehand drawing of a car which is automatically replaced with the 3D model of a car using the present invention.
Figure 26:
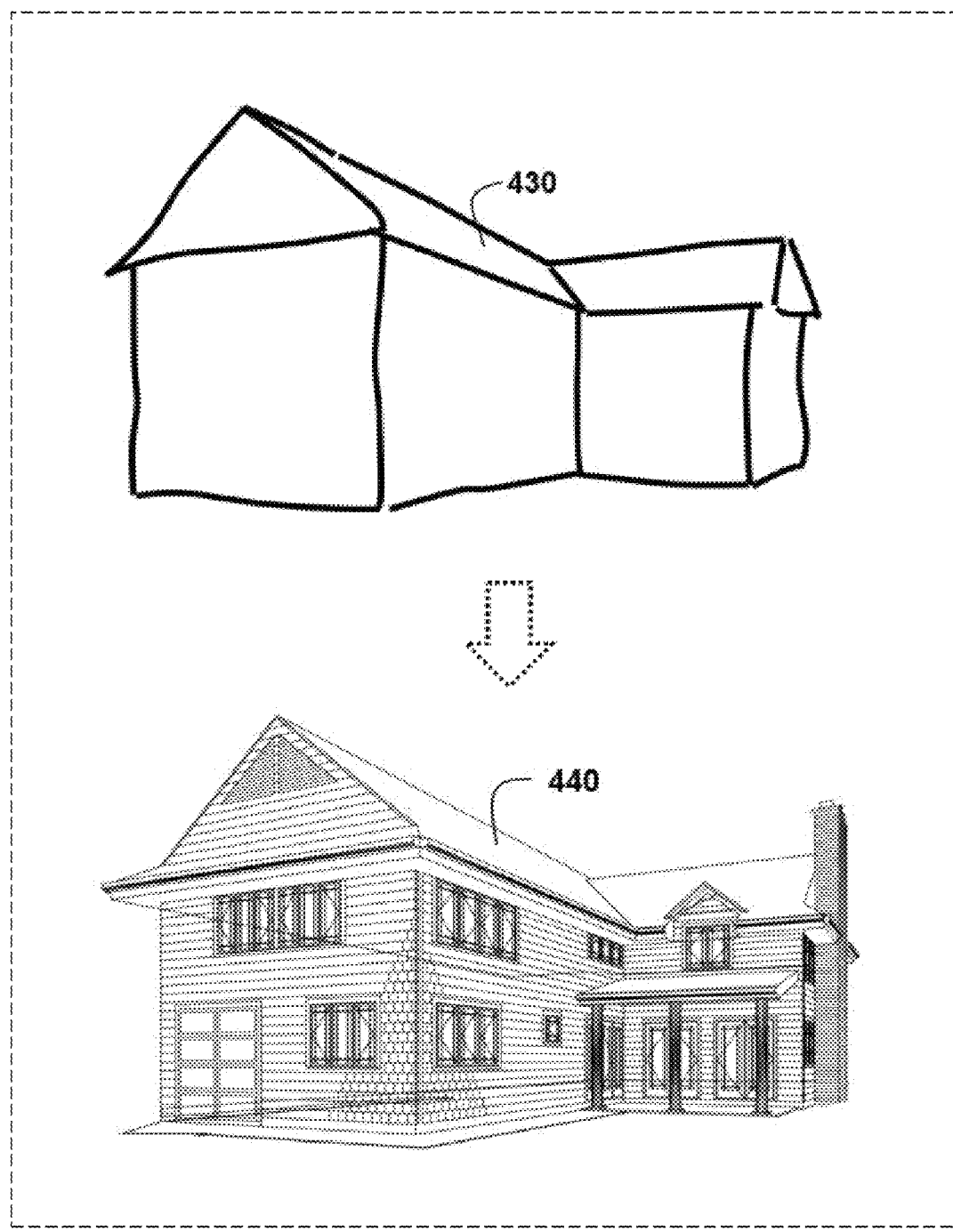
FIG. 26 illustrates a freehand drawing of a house which is automatically replaced with the 3D model of a house using the present invention.
Figure 27:
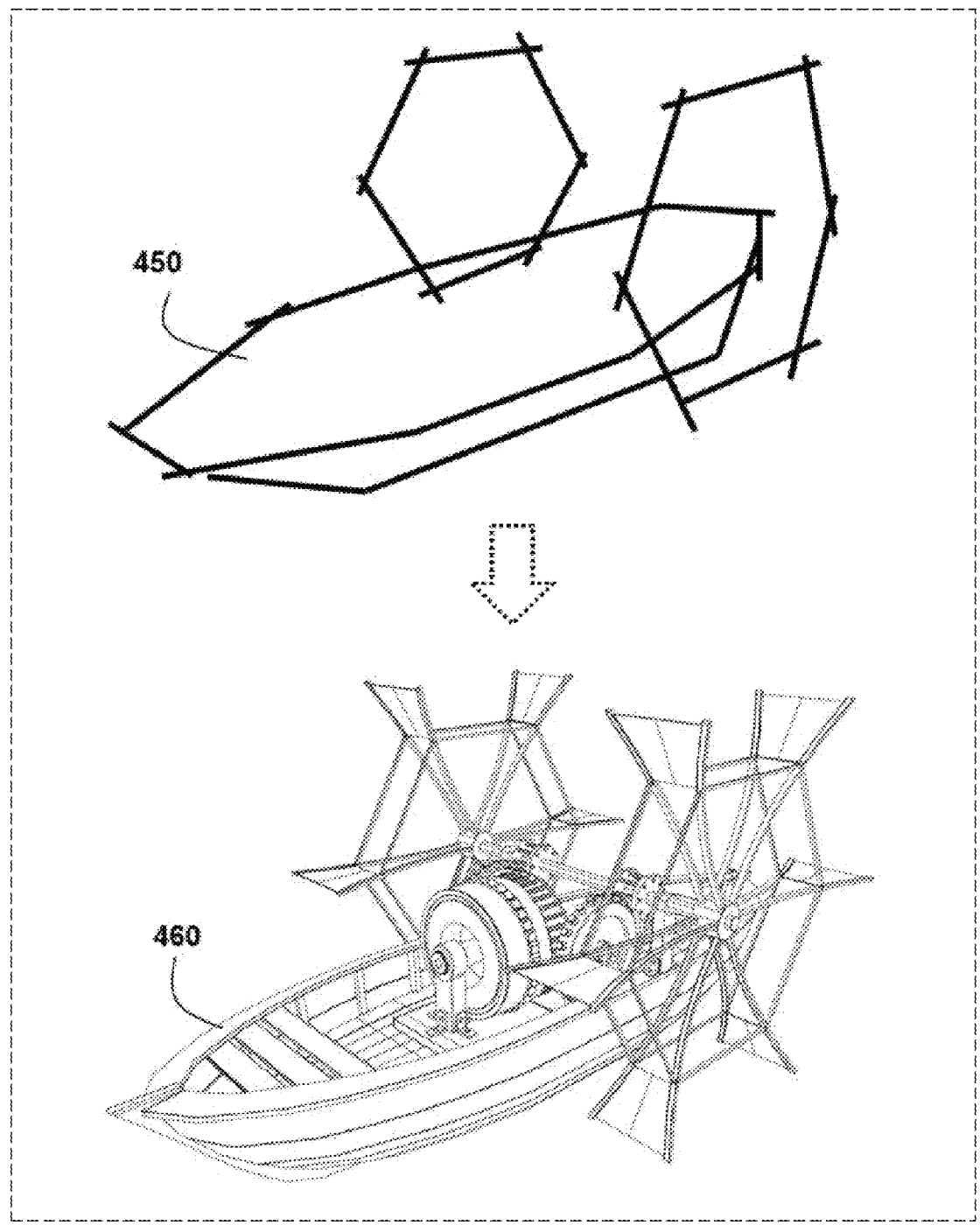
FIG. 27 illustrates a freehand drawing of a boat which is automatically replaced with the 3D model of a boat using the present invention.

FIGS. 23 to 27 illustrate five examples of the user's drawings, each of which is automatically converted into 3D models of different objects. In FIG. 23, the user's freehand drawing 370 represents a 3D model of a human's body 380. In FIG. 24, the user's freehand drawing 390 represents a 3D model of a horse 400. In FIG. 25, the user's freehand drawing 410 represents a 3D model of a car 420. In FIG. 26, the user's freehand drawing 430 represents a 3D model of a home 440. In FIG. 27, the user's freehand drawing 450 represents a 3D model of a boat 460. If the database of the present invention stores the images of the five aforementioned 3D models, it is clear to see how each one of the five freehand drawing leads to an accurate 3D model. This is based on the outlines of each freehand drawing, which are approximately similar to the boundary lines of its 3D model than any other 3D models stored in the database.

In one embodiment of the present invention, the user draws on a blank computer display where the 3D model automatically replaces the user's drawings using what is stored in the database. The user can select the color, texture or appearance of the 3D model from a wide variety of listed options that appear on the computer display or can be automatically generated by the computer system using a default setting.

In another embodiment, the present invention enables the user to convert a picture of a 3D object into a 3D model of the object, without needing to store the 3D model of the object in a database. This method suits the 3D objects that are comprised of a combination of basic 3D shapes such as cubes, prisms, pyramids, spheres or cylinders. For example, a picture of a home can be converted into a 3D model of the home by tracing geometrical shapes over the home's picture to mark the outlines of the walls and roof that appear in the picture. The outlines of the walls and roof form basic geometrical shapes that can be compared to a database that stores basic 3D shapes, as was described previously. Once the geometrical shapes are identified, they are replaced with corresponding models of 3D shapes. The colors, texture and appearance of the corresponding models are taken from the picture to generate a 3D model of the home that matches the picture.

This method can be used with a mobile phone or tablet after taking a picture of an object such as a building or product in order to convert this picture into a 3D model representing the object on the display of the mobile phone or tablet. The method can also be used on a computer display to efficiently convert images found on the Internet or through search engines, such as GOOGLE or BING search engines, into 3D models.

In one embodiment of the present invention, each 3D model in the database can be associated with drawings or symbols other than the views of the 3D model. For example, the English letters "A", "B", and "C" can be associated with a 3D model of a car rotated to successively appear from front, side and top. Accordingly, once a use writes the letter "A" on the display the 3D model of the car automatically replaces the letter, as "A" is an indication to present the car from its front view point. Drawings can be associated with more than English letters—for example, the drawings can be various symbols, numbers, or simple shapes. This method is useful when creating a 3D model of a scene such as a home where some additional trees, people or cars are needed to be placed by the 3D model of the home without spending much time in creating such additional objects.

In one embodiment, the present invention can grow in ability to accurately detect the identity of the 3D model indicated in the freehand drawing, using assessments based on the classification of the 3D models stored in the database and the user's previous form inclinations. For example, if a user at first creates a 3D model representing a chair, then the assumption is loosely made that the following 3D model drawn by a user represents a piece of furniture, such as a sofa, table or desk. Should the drawing provided by the user lead to multiple different 3D models, typically leading to confusion, then priority is given smartly to the 3D model that is most closely classified as a piece of furniture. To achieve this, the database will include additional identifications or classifications rather than just identity of the 3D model or object.

In another embodiment, once the 3D model is created, the user can assign dimensions to each part of the 3D model so that the model developed is correctly scaled to meet the specific purposes. If a dimension of a part of the 3D model is missing, the method of the present invention detects this missing dimension by comparing the length ratios of the 3D model parts relative to each other.

Figure 28:
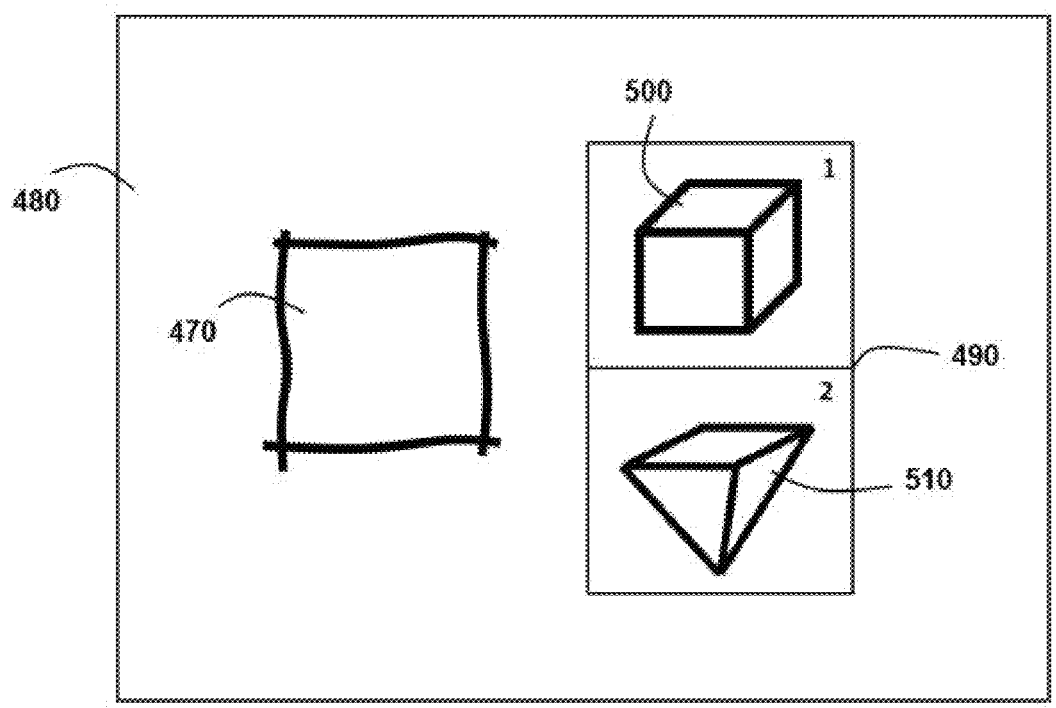
FIG. 28 illustrates an example of a list of options which presents alternative 3D models that can possibly match the user's freehand drawing.

In one embodiment of the present invention, if the user's freehand drawing is not clear enough or it can possibly interpreted as multiple different 3D models in the database, then the present invention presents a list of options presenting these differing 3D model from which the user can select whatever 3D model they feel is most suitable. For example, FIG. 28 illustrates a freehand sketch of a square 470 drawn by a user on a computer display 480 where a list of options 490 are presented to the user, including a cube 500 and pyramid 510. As shown in the figure, the freehand sketch or square may represent a top view of a cube or pyramid, and accordingly the list of options presents these two options of a cube or pyramid. If the user selects the cube from the list of option, the 3D model of the cube replaces the freehand sketch. If the user selects the pyramid from the list of option, the 3D model of the pyramid replaces the freehand sketch.

Using the list of options is critical in cases when comparing the outlines of the freehand drawings of the user with the outlines of the images of the 3D models stored in the database. For example, a freehand drawing representing an animal, such as a lion, could be similar to the outlines of potentially accurate 3D models of a lion, tiger, dog and cat. In this case, the list of options presents the four choices of "lion, tiger, dog and cat", allowing the user to select one of them. Once the user selects one of these four options, the 3D model of the selected animal replaces the freehand drawing of the user.

In one embodiment of the present invention, the list of options may be presented before the user finishes their freehand drawing. For example, once a part of the freehand drawing is provided and matches parts of various 3D models stored in the database, the list of options is automatically presented to the user, offering images of a variety of plausible 3D models. Once the user selects an option from the list of options, the selected 3D model replaces the freehand drawing. This method speeds up the creation of the 3D model without requiring the user to finish their freehand drawing.

In another embodiment of the present invention, the user's freehand drawings can be inputted though a myriad of software drawing tools to help users who are not good at making freehand drawings to draw simple two-dimensional shapes. In one embodiment, it is also possible to use a pencil to draw on a piece of paper and then take a picture of the drawing using a mobile phone or tablet camera to convert the picture of the drawing into a 3D model on the display of the mobile phone or camera.

In yet another embodiment, the method of the present invention is implemented with pictures without the use of any freehand drawings. This is achieved by using a computer vision program or technique, as known in the art, to detect the edges of the objects located in the picture and form polygons representing the surfaces of the objects. The polygons are then compared to a stored database of the present invention to identify the 3D objects located in the picture and replace them with corresponding 3D models. This method is perfectly compatible with optical head-mounted computer, such as GOOGLE GLAS, to convert what the user sees into a 3D model. In this case, the user can rotate the 3D model to see the hidden parts of the objects located in front of him/her. As described previously, the color, texture or appearance of the hidden parts of the 3D model will match the parts of the objects that appear in the picture in front of the user.

The invention claimed is:
1. A method of 3D modeling comprising:
receiving successive drawings each of which representing a view of a 3D model according to horizontal and vertical rotations of the 3D model;
analyzing each drawing of the successive drawings to determine the polygons located in the each drawing and the positions of the polygons relative to each other;
checking the polygons and the positions against a database that stores a plurality of 3D models each of which associated with a plurality of polygons, descriptions of the positions of the plurality of polygons relative to each other, and horizontal and vertical rotations; and
presenting the 3D model according to the horizontal and vertical rotations indicated in the last received drawing of the successive drawings.

2. The method of claim 1 wherein the successive drawings are freehand drawings or sketches drawn on a display.

3. The method of claim 1 wherein the 3D model can be rotated on a display and other successive drawings are drawn on the display to modify the 3D model.

4. The method of claim 1 wherein one or more lines of the successive drawings represent a hidden part of the 3D model relative to a point of view.

5. The method of claim 1 further dimensions are provided by a user to describe the size of the 3D model.

6. The method of claim 1 further the presenting includes displaying a list of options that contains multiple 3D models where a user can select one of the multiple 3D models to be presented.

7. The method of claim 1 further an assessment program is utilized to detect the identity of the 3D model indicated in the drawing using assessments based on the classification of the 3D models stored in the database and the user's previous form inclinations.

8. A method of 3D modeling comprising:
receiving a drawing representing a view of a 3D model relative to a point of view according to horizontal and vertical rotations of the 3D model;
checking the drawing against a database that stores a plurality of 3D models each of which associated with a plurality of shapes representing a 3D object according to horizontal and vertical rotations from different points of view; and
presenting the 3D model that has outlines of a shape approximately matches the outlines of the drawing wherein the 3D model is presented according to the point of view and the horizontal and vertical rotations of the drawing.

9. The method of claim 8 wherein the drawing is a freehand drawing or sketch drawn on a display of an electronic device.

10. The method of claim 8 wherein the drawing is a picture of a freehand drawing captured by a camera of a device such as a mobile phone or tablet and the 3D model is presented on the display of the device.

11. The method of claim 8 wherein the checking includes comparing the percentage of the common area between the drawing and each one of the plurality of shapes.

12. The method of claim 8 further the drawing may be automatically modified, resized or stretched-before the comparing.

13. The method of claim 8 further the presenting includes displaying a list of options that contains multiple 3D models where a user can select one of the multiple 3D models to be presented.

14. The method of claim 13 further the list of options is displayed upon receiving a part of the drawing wherein the part can lead to various 3D models of the database.

15. A method of 3D modeling comprising:
receiving a picture of an object;
tracing the outlines of the geometrical shapes located in the picture of the object;
checking the geometrical shapes against a database that stores a plurality of 3D models each of which associated with a plurality of polygons, descriptions of the positions of the plurality of polygons relative to each other, and horizontal and vertical rotations; and
presenting the 3D model according to the horizontal and vertical rotations of the object that are indicated in the geometrical shapes.

16. The method of claim 15 wherein the tracing is automatically achieved by using a computer vision program.

17. The method of claim 15 wherein the appearance of the surfaces of the 3D model matches the appearance of the surfaces of the object that appear in the picture.

18. The method of claim 15 wherein the picture is captured by a camera of a device such as a mobile phone or tablet and the 3D model is presented on the display of the device.

19. The method of claim 15 wherein the picture is presented on a computer display and the 3D model is presented on the top of the picture on the computer display.

20. The method of claim 15 wherein the picture is a projection of a real object on an optical head-mounted display and the 3D model is projected on the top of the picture on the optical head-mounted display.

\* \* \* \* \*